United States Patent [19]

Donelon et al.

[11] Patent Number: 4,684,437

[45] Date of Patent: Aug. 4, 1987

[54] SELECTIVE METAL ETCHING IN METAL/POLYMER STRUCTURES

[75] Inventors: John J. Donelon, Mahopac; Yaffa Tomkiewicz, Scarsdale; Thomas A. Wassick, Wappingers Falls; James T. Yeh, Katonah, all of N.Y.

[73] Assignee: International Business Machines Corporation, Armonk, N.Y.

[21] Appl. No.: 793,608

[22] Filed: Oct. 31, 1985

[51] Int. Cl.$^4$ ............................................. B44C 1/22
[52] U.S. Cl. ..................................................... 156/643
[58] Field of Search ............................. 29/569 L, 580; 204/192 E; 156/643, 646, 655, 662

[56] References Cited

U.S. PATENT DOCUMENTS

| | | | |
|---|---|---|---|
| 4,414,059 | 11/1983 | Blum et al. | 156/643 |
| 4,490,211 | 12/1984 | Chen et al. | 156/643 |
| 4,568,632 | 2/1986 | Blum et al. | 156/643 |

Primary Examiner—Ivars Cintins
Attorney, Agent, or Firm—Jackson E. Stanland

[57] ABSTRACT

A differential material removal process wherein a selected material can be rapidly removed without adverse impact to surrounding layers of different materials. Ultraviolet radiation is used to selectively remove metal without adversely harming adjacent polymer layers, in a metal-polymer multilayer structure. The wavelength (100–400 nm) of the ultraviolet radiation and the energy fluence per pulse are selected so that the removal rate of metal due to thermal processes is significantly greater than the removal rate of the polymer by ablative photodecomposition. This can occur at an energy fluence per pulse level greater than that at which the etch rate of the polymer begins to level off. For example, copper of a thickness less than 5 microns is rapidly etched in one or two pulses while adjacent polyimide layers are substantially unetched by the application of ultraviolet pulses of wave-lengths 248–351 nm, at energy fluences per pulse in excess of approximately 3 or 4 J/cm$^2$.

21 Claims, 5 Drawing Figures

SELECTIVE METAL ETCHING IN METAL/POLYMER STRUCTURES

DESCRIPTION

1. Field of the Invention

This invention relates to selective etching of metal lines by ultraviolet laser radiation, and more particularly to a technique for selectively removing metal in a metal-polymer environment without adversely harming or otherwise etching the polymer, by the incidence of laser pulses having wavelengths in the range 100–400 nm and energy fluences sufficient to produce a differential etch rate such that the incident laser pulses will rapidly etch the metal while only insubstantially etching the polymer.

2. Background Art

It is well known to use lasers for many purposes in the microelectronics and packaging industries, where lasers have been used for such diverse applications as etching, film deposition, repair of open circuits and short circuits, machining and trimming of component values, and heating of solder connections. Reference is made to the following articles and patents as illustrative examples of these uses of lasers:

P. W. Cook et al, IBM Technical Disclosure Bulletin, Vol. 17, No. 1, p. 242, June 1974.

J. A. Brunner et al, IBM Technical Disclosure Bulletin, Vol. 22, No. 12, p. 5319, May 1980.

G. T. Sincerbox et al, IBM Technical Disclosure Bulletin, Vol. 23, No. 4, p. 1684, September 1980.

U.S. Pat. Nos. 4,172,741; 4,258,078; and 4,448,636.

In these applications, the laser pulses are primarily used as heat sources, in order to melt, ablate, or otherwise alter a material through a thermal mechanism. However, the use of a thermal mechanism can often lead to damage to the surrounding layers or underlayers, which is particularly pronounced when the laser pulses are not well focused and where the surrounding layers are very heat-sensitive. In this latter situation, surrounding dielectric or protective layers, such as polymers, can have their mechanical and chemical properties seriously altered by these thermal effects. At visible wavelengths the absorption coefficients of these polymer layers are very small and the polymers are essentially transparent to this radiation. In such cases the structure beneath the protective or dielectric layers can also be affected and is sometimes damaged.

A newly discovered laser technique, termed ablative photodecomposition (APD), does not totally rely on a thermal mechanism for etching polymeric materials. Instead, photochemical, thermal, and other effects are the contributing mechanisms by which polymeric materials are rapidly and cleanly etched without damage to surrounding layers of the same, or different materials. APD relies on the incidence of ultraviolet radiation having wavelengths less than 400 nm, and a sufficiently large energy fluence per pulse that the threshold for ablative photodecomposition is overcome.

The concept of APD has been described in the following references:

R. Srinivasan, J. Vac. Sci. Technol., B1 (4) p. 923, October–December 1983.

R. Srinivasan et al, J. Polymer Science: Polymer Chemistry Edition, Vol. 22, 2601–2609 (1974).

APD is a process in which ultraviolet radiation of wavelengths less than 400 nm causes new effects in different materials. These materials absorb a very high percentage of this radiation in a very thin surface layer of the material, wherein the absorption of the radiation is confined to a very small volume of the material. This absorption occurs very rapidly and produces material fragments which explode or "ablate" from the surface of the ablated materials, leaving behind a localized etched region. Application of further pulses of radiation will cause additional etching.

As noted, this effect requires the UV radiation to have an energy fluence which exceeds a particular threshold. This threshold depends on the wavelength of the incident radiation and on the material being ablated. Also, the pulse width and duty cycle of the radiation must be such that the incident energy is delivered to the material more quickly than it can be lost through normal thermal relaxation processes. Generally, lasers of the excimer-type provide very useful sources of radiation in the desired wavelength range, and can be used to produce pulsed radiation of sufficient energy fluence per pulse to cause ablative photodecomposition. In particular, some commercially available excimer lasers suitable for this purpose include the argon fluoride excimer laser (193 nm), the krypton fluoride excimer laser (248 nm), the xenon chloride excimer laser (308 nm), and the xenon flouride excimer laser (351 nm).

Generally, the threshold energy fluence per pulse required for ablative photodecomposition increases as the wavelength increases, for a given material. Thus, for a given material, the required energy fluence per pulse is greater for 351 nm radiation than for 193 nm radiation. However, the required optics are usually less complicated and costly for higher wavelength radiation. For example, the optics required for radiation at 351 nm wavelength are less complicated and less expensive than those required for 193 nm wavelength radiation. Of course, these considerations regarding the necessary optics and the type of available sources that can be used are well known to those skilled in the laser and optics technologies.

UV pulse radiation has been applied by many people for many uses in order to provide significant processing advantages. Some of the uses of this effect include the deposition of metal (U.S. Pat. No. 4,451,503), the photoetching of polyesters (U.S. Pat. No. 4,417,948), the deposition of metals on polyester by irradiation of selected areas with UV, followed by a preplating treatment and then electroless plating (U.S. Pat. No. 4,440,801), photoetching of polyimides (co-pending application Ser. No. 561,445, filed Dec. 14, 1983, and U.S. Pat. No. 4,508,749), surgical and dental procedures wherein organic tissue is irradiated with UV (co-pending application Ser. No. 448,123, filed Dec. 9, 1982), conversion of SiO to $SiO_2$ (co-pending application Ser. No. 448,127, filed Dec. 9, 1982, and now abandoned), and dry photolithography in which resist-type materials are patterned by irradiation with UV wavelengths (U.S. Pat. No. 4,414,059).

Thus, while pulsed UV irradiation has been applied to the deposition and etching (APD) of many materials, these procedures have involved energy fluences per pulse roughly between about 10 $mJ/cm^2$ and 350 $mJ/cm^2$. The reason for this may be that most polymer-type materials appear to be ablatively photodecomposed most efficiently at energy fluences of about 350 $mJ/cm^2$ or less. APD has not been applied to differential etching of metal lines in a metal-polymer environment where the polymer cannot be adversely etched (i.e., excessively etched) during etching of the metal lines. One reason for this may have been the concern that, at the fluence levels generally used, it would not be possible to protect the polymer layers from excessive etching without the use of a mask, while the metal lines were being etched. Stated another way, it would have been expected that etching of metal would cause an excessive amount of APD of the surrounding polymer layers. For multilevel thin film structures using very thin polymer films (for example, 5-10 microns of polyimide), this problem becomes more severe since these thin polymer films in the vicinity of or under the metal may be severely damaged during metal etching. This damage can be in the form of bubbling, exploding, and charring of the polymers.

The aforementioned damage to polymer layers during the etching of metals is primarily caused by the use of laser beam spots which do not perfectly match the shape of the metal to be etched, thereby exposing the polymer layers to radiation. Another cause of polymer damage in systems using lasers emitting light in the visible to infrared wavelength ranges is that the light absorption coefficient of the polymers is very small at these wavelengths. This means that the focused laser beam will go through microns or tens of microns of polymer before it is attenuated to a level which causes little damage. Therefore, the damaged layer can be microns deep in the polyimide, thereby rendering it ineffective as a protective dielectric layer.

Ultraviolet wavelength pulses, on the other hand, are readily absorbed in most polymers due to their high absorption coefficients at these wavelengths. However, at the conventionally used energy fluences, considerable amounts of polymer would be ablated along with the metal lines. Since laser processing is attractive for many reasons, it is a primary object of the present invention to provide a technique wherein laser etching can be safely used in an environment including multilayer structures of metals and polymers. To this end, it has been discovered that, if the energy fluence per pulse is increased to an amount at least an order of magnitude beyond that conventionally used, the etch rates of polymers will be very small with respect to the etch rates of metals, thereby allowing selective etching of metals and minimum harm to the surrounding polymer layers.

Thus, it is another object of the present invention to provide a differential etch technique for selectively etching metal in metal-polymer structures.

It is another object of the present invention to provide a differential etching technique that can be applied to multilayer structures of metals and polymers, to provide selective etching of a variety of metals without adversely etching nearby thin polymer layers.

It is another object of the present invention to provide a technique for dry photoprocessing of multilayer structures, such as those which are commonly used in microelectronics and packaging.

It is another object of the present invention to provide a differential etching technique that can be used for selective etching of one material in a structure comprised of a plurality of materials, where the materials are those commonly employed in microelectronic structures and packaging.

It is another object of the present invention to provide an improved technique for ablation of metals on polymers, where the metals can be selectively removed without severe damage to the polymers.

It is another object of the present invention to provide a selective etching technique which can be applied to copper-polyimide structures in order to selectively etch copper while not adversely etching polyimide.

DISCLOSURE OF THE INVENTION

This invention is a technique for selective etching of metals in an environment including both metal layers and polymer layers, in a manner to completely etch the metal layers without substantial etching of the polymer layers. Ultraviolet radiation in the wavelength range 100-400 nm is applied to structures that include both metals and polymers, where the energy fluence per pulse of the laser radiation is sufficiently high that the metal etches more rapidly than the polymers, and preferably at least about twice as fast.

As an example, a few microns of copper can be etched approximately twice as fast as polyimide can be ablated, for irradiation with laser pulses in the wavelength range 100-400 nm and energy fluence per laser pulse of approximately $4J/cm^2$. However, for energy fluences per pulse in excess of about $1J/cm^2$, differential etching will occur, but to a lesser degree. Thus, the invention is directed to a technique in which far UV radiation of wavelengths 100-400 nm is used to ablate (etch) metals in the presence of polymers, and especially thin polymer layers, wherein the metal layers are completely etched while the degree of etching to the polymer layers is minimal even though the polymer layers are exposed to the laser radiation.

Examples of metal/polymer structures are those that include metals such as copper, Au, Ti, W, Cr, Ni, sandwich metallurgies such as Cr-Cu-Cr and Cr-Cu-Ni-Au-Cr, and polymers such as polyimide, resist materials, mylarIM, PMMA, etc. Metals which are highly reflective (i.e., $\sqrt{}60\%$) at these wavelengths generally have to be doped to reduce their reflectivity below this amount. An example, is Al doped with about 4% Cu, and other alloys.

These and other objects, features, and advantages will be apparent from the following more particular description of the preferred embodiments.

BEST MODE FOR CARRYING OUT THE INVENTION

Figure 1:
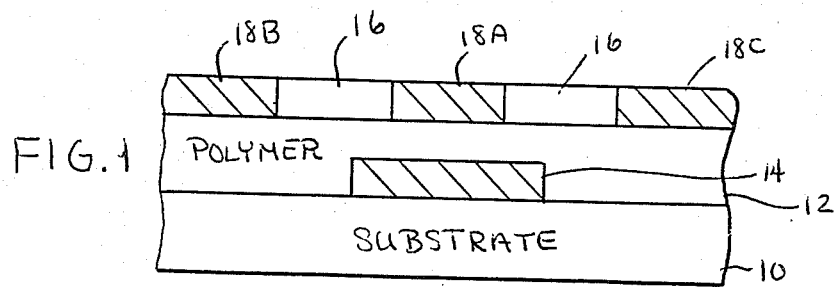
FIGS. 1-3 indicate the application of this invention to the selective etching of metal lines in a multilayer structure comprised of a plurality of metal lines separated by a polymer layer, where a metal line can be removed without undue damage to the underlying polymer layer or to other metal underlayers.

This invention relates to a differential etching technique that can be used to provide selective etching of a layer in a multilayer structure, without adversely etching other layers in the structure. More specifically, it is based on the discovery that, at sufficiently high energy fluences, the rate of etching of polymers via APD will be significantly less than the rate of etching of metals, for incident UV laser pulses in the wavelength range 100–400 nm. This allows one to etch metals completely while not excessively etching an exposed polymer layer. Thus, the thickness, integrity, mechanical and chemical properties of adjacent polymer layers is preserved.

In the practice of this invention, laser pulses are utilized for etching selected layers in a multilayer structure. The wavelength, energy fluence per pulse, pulse width, and duty cycle of the laser pulses are chosen so that polymer layers in the multilayer structure will undergo ablative photodecomposition (of only a limited amount)—the mechanism of etching of the metal layers is not important and is generally a thermal mechanism. The pulse width and duty cycle of the radiation is chosen so that APD of the polymer will occur. Thus, a sufficient amount of energy is delivered that the threshold for APD is exceeded in a time period that is short with respect to thermal diffusion lengths in the polymer. Pulse widths of less than about 100 ns have been found to be satisfactory.

Since the polymer layer often separates metal layers, the polymer layer must not be transparent to the incident radiation in order to prevent this radiation from being transmitted to an underlying metal layer. However, the polymer must not be excessively etched by absorption of this radiation. Therefore, the wavelength range and energy fluence per pulse are critical to have selective absorption with minimal etching of the polymer. This requirement insures that the thickness and integrity of the polymer layer are preserved, while at the same time protecting underlying metal layers from being etched when an overlying metal layer is selectively removed.

Still further, in the practice of the present invention it has been discovered that a minimum number of laser pulses, and preferably only one, can be used to provide the desired selective etching of many thicknesses of the metal lines. This also minimizes damage to surrounding or underlying metal and/or polymer layers which are not to be etched.

In the practice of this invention, the characteristics of the laser radiation are chosen so that the metal etch rate is at least about twice as fast as the polymer etch rate, for exposure to the same radiation. Of course, even these large differentials may not be sufficient to protect the polymer layer if that layer is very much thinner than the metal layer. On the other hand, if the polymer layer is much thicker than the metal layer, successful selective etching of metal is possible even at much lower energy fluences where the etch rates of polymers and metals are substantially the same. As will be apparent to those skilled in the art, the amount of energy fluence/pulse will have to be increased as the thickness of the metal layer increases if it is desired to completely etch the metal layer with a minimum number of laser pulses.

Figure 2:
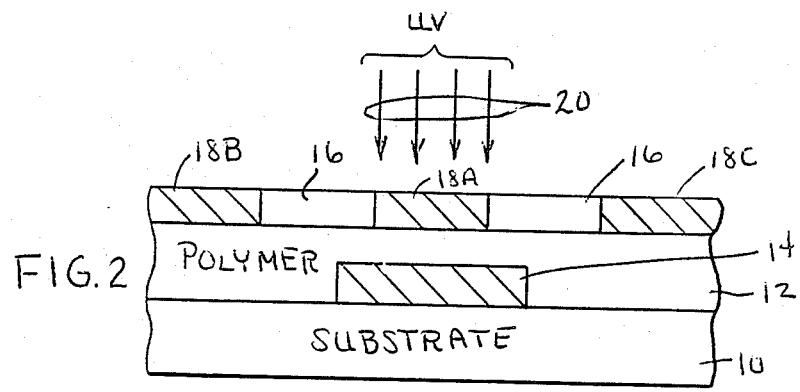
Figure 3:
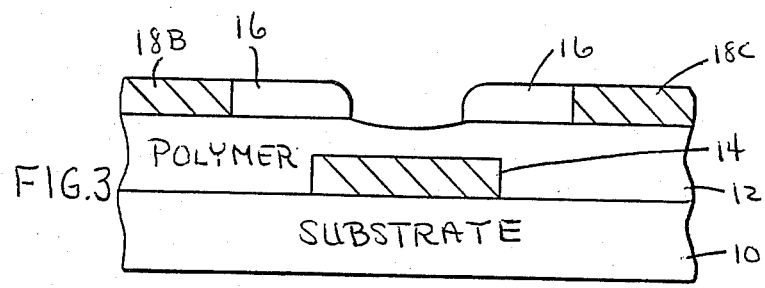

These concepts will become more apparent by reference to FIGS. 1–3, which illustrate the application of this process to a multilayer structure comprising a plurality of metal layers separated by a polymer layer. This structure is intended to be representative of the many different types of multilayer structures found in the microelectronics industry, and in particular in various electronic packages. In FIG. 1, the structure to be selectively etched includes a substrate 10, a layer 12 of polymer (such as polyimide), a first metal layer 14, another layer 16 of polymer, and a further metal layer comprised of portions 18A, 18B, and 18C. It is desired to selectively etch portion 18A without adversely (i.e., excessively) etching metal portions 18B, 18C, and underlying metal 14. In order to do so, the incident laser pulses must not substantially etch polymers 12 and 16. However, this is difficult to accomplish because the input laser beam often is not perfectly matched to the size of the metal region to be etched, and the polymer layer often does not have a sufficiently high absorption coefficient for the incoming laser pulses. By operating with selected wavelengths and energy fluences per pulse, however, the desired result is achieved, as will be explained with reference to FIGS. 2 and 3.

In FIG. 2, ultraviolet light represented by arrows 20 impinges upon the multilayer structure, and more particularly on metal 18A.

The ultraviolet radiation 20 can be directed through a mask (not shown) onto the multilayer structure, or a focussed light beam can be directed across the surface of metal 18A, in order to etch it. Further, it is preferrable that the entire depth of metal 18A be etched by a single laser pulse (or very few pulses), rather than requiring several pulses for the complete etching. This provides high efficiency etching and also minimizes any possible damage and/or etching to surrounding polymer regions 12 and 16. Still further, polymer regions 12 and 16 must have a high absorption coefficient for the incoming radiation to prevent this radiation from being transmitted to laterally adjacent metal portions 18B and 18C, and to underlying metal portion 14.

FIG. 3 shows the result that is achieved when the incoming ultraviolet radiation has a properly selected wavelength and energy fluence per pulse. In this figure, metal portion 18A has been completely etched, there being no damage to metal portions 14, 18B, and 18C. Polymer regions 12 and 16 have been minimally etched by the radiation and still provide a protective and/or dielectric function. These functions are maintained even if polymer regions 12 and 16 are very thin or very narrow.

The ultraviolet radiation 20 has a wavelength and energy fluence per pulse such that the etch rates of metal and polymer are dissimilar, and preferably dissimilar by a factor of at least 2. This is accomplished if the wavelength and energy fluence per pulse are chosen such that the metal layer is rapidly etched, or ablated, while the polymer layer undergoes only a small amount of ablative photocomposition (i.e., the removal rate of the polymer is small and approximately constant). For some polymers, this minimum energy fluence is approximately 3–6 J/cm$^2$, per pulse. This minimum fluence depends on the metal thickness and metal absorption. Thicker metal films will require higher energy fluences in order to be etched with a very small amount of pulses, as explained previously. The wavelength range for the ultraviolet radiation is 100–400 nm, but the particular wavelength chosen is matched to the relative rates of etching of the metal and the polymer. The polymer must etch slowly by APD, while the metal must etch rapidly by any mechanism, and generally a thermal mechanism.

The foregoing will be more clear with reference to FIGS. 4 and 5, and the examples to be described hereinafter.

Figure 4:
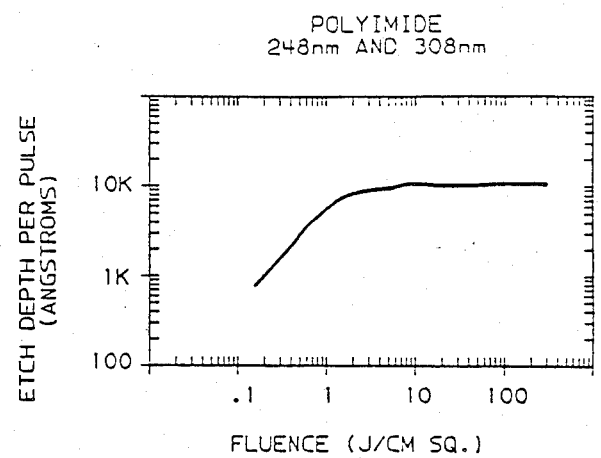
FIG. 4 is a plot of etch depth per pulse versus energy fluence per pulse, for the ablative photodecomposition of polyimide at 248 nm and 308 nm, illustrating the saturation effect that occurs when this material is ablatively photodecomposed at energy fluences above approximately $3J/cm^2$.

FIG. 4 plots the etch depth per pulse, in angstroms, for polyimide which is etched with radiation of 248 nm and 308 nm, as a function of the energy fluence per pulse. While this polyimide is spin applied, similar results (within about 10%) have been found when Kapton (a trademark of E. I. Dupont de Nemours) is used.

As is apparent from FIG. 4, the etch rate of polyimide at these wavelengths saturates at approximately 3-5 J/cm$^2$ and remains relatively constant thereafter. On the other hand, a metal such as copper (of a few microns thickness) will be rapidly removed by laser pulses having energy fluences greater than this amount.

This type of saturation may exist for longer wavelengths and for shorter wavelengths than those illustrated in FIG. 4. It is anticipated that polyimide will saturate at a higher fluence if the wavelength is increased beyond 308 nm, and will saturate at a lesser fluence for wavelengths less than 248 nm. For example, the saturation level for 351 nm laser pulses is higher than that for 308 nm radiation, but only slightly higher.

Figure 5:
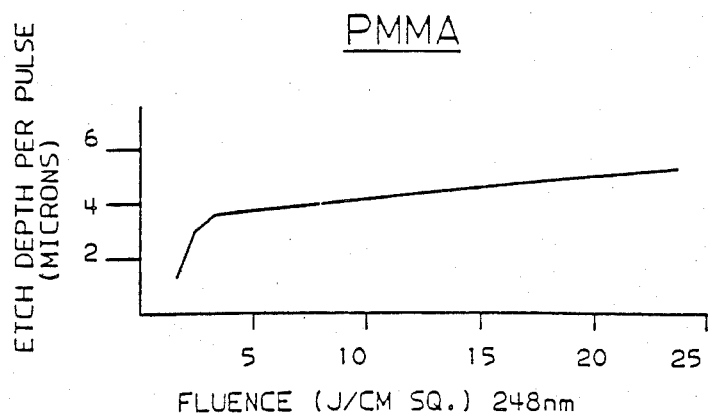
FIG. 5 is a curve of etch depth per pulse versus energy fluence per pulse for the ablative photodecomposition of PMMA (polymethyl methyacrylate), illustrating the saturation effect which occurs at approximately $3J/cm^2$, at 248 nm.

FIG. 5 is a plot of etch depth per pulse versus energy fluence per pulse for ablative photodecomposition of polymethyl methyacrylate (PMMA), at 248 nm. This plot also shows a saturation effect in the etch rate of the polymer, where the saturation occurs in the approximate range of 4-8 J/cm$^2$. This saturation effect is even more pronounced when the energy fluence for ablative photocomposition is approximately 24 J/cm$^2$. Of course, the removal rate of a metal at these high fluences is extremely large, and several microns of metal can be removed in a single laser pulse at these fluence levels.

In contrast with the leveling-off of the etch rate of PMMA illustrated in FIG. 5, this leveling-off is not observed for ablative photodecomposition of PMMA at 308 nm. Thus, in the practice of this invention it is important to choose both the wavelength and energy fluence such that the metal is rapidly removed, while the polymer is only very slightly etched by an ablative process. In order to have a large tolerance window when etching, the energy fluence can be set at an amount where the APD of the polymer has leveled-off.

As a specific example, a multilayer structure comprising polyimide and copper has been selectively etched to remove a copper layer without undue etching or harm to the polyimide layers. For laser radiation of wavelengths 248 nm, 308 nm, and 351 nm, and energy fluences per pulse in excess of 3J/cm$^2$, selective etching can be accomplished. Four microns of sputtered copper film on cured polyimide can be etched in about two laser pulses at a fluence of approximately 4J/cm$^2$ at 248 nm and 351 nm. The polyimide removal rate at such fluences is very small, and is approximately 1 micron/pulse at 351 nm. Using a fluence of 4J/cm$^2$ and a wavelength of 248 nm, a sputtered copper film of 4 microns thickness is etched in 1-2 pulses, while 7 pulses at the same energy fluence and wavelength are required to etch 5 microns of polyimide. Thus, the relative rates of etching of the copper and polyimide are very dissimilar and selective etching of a multilayer structure can be done without harm to surrounding or underlying metal layers.

Another advantage is that the reflectivity of many metals is substantially reduced in the wavelength range used in this invention. For example, copper has a reflectivity in the visible and infrared regions which is greater than 90%. The reflectivity of copper drops to less than 50% in the wavelength range used in the present invention. Thus, there is an improved coupling of the incident energy into the metal film to be removed at these short wavelengths. This, in combination with the high absorption coefficient of polymers at these wavelenghs, leads to almost total absorption of the ultraviolet radiation in an extremely thin surface region of the polymer, thereby leaving the bulk of the polymer unetched and otherwise unharmed. As an example, a thin surface region of polyimide less than 1 micron would be affected by an ultraviolet pulse in this range of wavelengths, while several microns of copper would be totally removed by this single laser pulse.

Thus, in the practice of this invention, selected regions of a metal, such as copper, Cu-doped Al, titanium, tungsten, etc. can be removed rapidly with one or two laser pulses, while the same laser pulses will affect only a very thin surface region of the polymer, if the wavelength and energy fluence per pulse of the ultraviolet radiation are suitably chosen. In accordance with the principles of this invention, this choice is such that a considerable depth of metal is removed rapidly while the polymer is ablatively photodecomposed by only a minimum amount. Thermal effects are not necessarily a dominant mechanism in the ablation of the polymer, but are probably the dominant effect in the metal removal process.

It will be appreciated by those of skill in the art that ablative photodecomposition of polymers will occur at low energy thresholds, approximating 10-30 mJ/cm$^2$. However, at these energy fluence levels, no metal removal is observed. Thus, this is not an appropriate regime for a selective etching operation. Instead, the energy fluence per pulse has to be sufficiently high that the metal removal rate is rapid, while the polymer etch rate due to ablative photodecomposition is small (and preferably has leveled-off) with respect to the metal removal rate.

While the invention has been described with respect to particular embodiments thereof, it will be apparent to those of skill in the art that variations can be made therein without departing from the spirit and scope of the present invention. For example, metals and polymers other than those specifically illustrated herein can be envisioned for specified wavelengths and energy fluences in order to provide selective removal of these metals from multilayer structures. However, such metal and polymer combinations will be etched in accordance with the principles of the present invention.

We claim:

1. A method for removing a metal layer from a structure, in the presence of a polymer layer, without substantial removal of said polymer layer, by the step of
    irradiating said metal layer with pulsed ultraviolet radiation of a wavelength in the range 100-400 nm and an energy fluence per pulse sufficiently high that said metal is rapidly removed in one or two pulses while only a thin surface region less than a few microns of said polymer is etched by said ultraviolet radiation pulses said energy fluence per pulse being greater than 3-5 J/cm$^2$.

2. The method of claim 1, where said metal layer is comprised of copper, and said polymer layer is comprised of polyimide.

3. The method of claim 1, where said structure is a multilayer structure having a polymer layer separating two metal layers.

4. The method of claim 1, where said polymer layer is comprised of materials selected from the group consisting of resists, PMMA, polyimides, and polyesters.

5. The method of claim 1, where said metal layer is comprised of copper and said polymer layer is comprised of polyimide, said wavelengths being in the range 248–351 nm and said energy fluence per pulse being greater than approximately 3J/cm².

6. The method of claim 5, where said structure is a multilayer structure having a copper layer of several microns thickness located on a polyimide layer of several microns thickness.

7. The method of claim 1, where said metal layer is comprised of copper and said polymer layer is comprised of polyimide, said wavelength being 193 nm.

8. A method for selectively removing a metal layer in a structure comprised of a plurality of metal and polymer layers, comprising the steps of:

positioning said structure in the path of ultraviolet laser pulses, said structure including at least one layer of a metal and one layer of a polymer, irradiating said structure with ultraviolet laser pulses to remove said metal layer without substantial etching of said polymer layer, said ultraviolet laser pulses having a wavelength and energy fluence per pulse such that the rate of removal of said metal layer by said laser pulses is at least twice as rapid as the rate of removal of the polymer layer by said laser pulses, for each said laser pulse.

9. The method of claim 8, where said metal layer is comprised of copper and said polymer layer is comprised of polyimide.

10. The method of claim 8, where said wavelength is in the range 100–400 nm and said energy fluence per pulse is greater than 3–5 J/cm².

11. The method of claim 8, where said wavelength and energy fluence per pulse are chosen such that said polymer has high absorption for said ultraviolet radiation and is ablatively photodecomposed to only a small depth less than a few microns, while said metal layer is completely removed.

12. The method of claim 8, where the wavelength of said ultraviolet radiation is 248 nm and the energy fluence per pulse of said ultraviolet radiation is sufficiently high that the curve of etch depth/pulse versus energy fluence/pulse exhibits a leveling-off.

13. The method of claim 8, where the wavelength of said ultraviolet radiation is 308 nm, and the energy fluence per pulse of said radiation is sufficiently high that the curve of etch depth/pulse versus energy fluence/pulse of said radiation has begun to level off.

14. The method of claim 8, where the wavelength of said ultraviolet radiation is 351 nm, and the energy fluence per pulse of said radiation is sufficiently high that the curve of etch depth/pulse versus energy fluence/pulse of said radiation has begun to level off.

15. A method for selectively etching a metal layer in the presence of a polymer layer, where said metal layer has a thickness of several microns and said polymer layer also has a thickness of several microns, said polymer being comprised of a material which exhibits an etch depth/pulse versus energy fluence/pulse curve which begins to level off with increasing energy fluence beyond a fluence $F=F_0$, when said polymer is ablatively photodecomposed by ultraviolet laser pulses having a wavelength in the range 100–400 nm, said removal process including the step of applying a single pulse of said ultraviolet radiation, said pulse having an energy fluence sufficiently high to completely remove said metal layer, said fluence being greater than $F_0$.

16. The method of claim 15, where said ultraviolet radiation pulse has a wavelength and energy fluence such that said metal layer is removed by a thermal mechanism and said polymer layer is only slightly removed by an ablative photodecomposition mechanism.

17. The method of claim 16, where said metal layer is comprised of copper and said polymer layer is comprised of polyimide.

18. A method for removing a copper layer located adjacent to a polyimide layer without substantial removal of said polyimide layer, said method including the steps of applying a number of pulses $\leq 5$ of ultraviolet radiation to said copper layer, said radiation having a wavelength in the range 100–400 nm and an energy fluence/pulse greater than about 3–5J/cm².

19. The method of claim 18, where said wavelength is 248 nm.

20. The method of claim 18, where said wavelength is 308 nm.

21. The method of claim 18, where said wavelength is 351 nm.

* * * * *